United States Patent
Yu

(10) Patent No.: US 9,213,058 B2
(45) Date of Patent: Dec. 15, 2015

(54) SERVER WITH CURRENT MONITORING SYSTEM

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Song Yu, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 299 days.

(21) Appl. No.: 13/730,816

(22) Filed: Dec. 28, 2012

(65) Prior Publication Data

US 2013/0241592 A1 Sep. 19, 2013

(30) Foreign Application Priority Data

Mar. 16, 2012 (CN) .......................... 2012 1 0070023

(51) Int. Cl.
| | | |
|---|---|---|
| G01R 31/28 | (2006.01) | |
| H02J 1/00 | (2006.01) | |
| G01R 19/165 | (2006.01) | |
| G06F 11/32 | (2006.01) | |
| H04W 4/00 | (2009.01) | |

(52) U.S. Cl.
CPC ........ *G01R 31/281* (2013.01); *G01R 19/16571* (2013.01); *G06F 11/326* (2013.01); *H02J 1/00* (2013.01); *H04W 4/00* (2013.01); *Y04S 40/00* (2013.01)

(58) Field of Classification Search
CPC ......... G06F 1/00; G06F 2101/00; G01R 1/00; H02J 1/00; G09G 1/00; G09G 2230/00; H02H 1/00; H04W 4/00; Y04S 20/00; Y04S 30/00; Y04S 40/00
USPC ..................... 324/522, 207.13, 207.15, 207.2, 324/207.21, 207.25, 242, 243, 247, 763.01
See application file for complete search history.

(56) References Cited

U.S. PATENT DOCUMENTS

| | | | | |
|---|---|---|---|---|
| 4,764,393 | A * | 8/1988 | Henger et al. | 427/8 |
| 5,686,839 | A * | 11/1997 | Takagi | 324/503 |
| 6,150,714 | A * | 11/2000 | Andreycak et al. | 257/690 |
| 7,825,666 | B2 * | 11/2010 | Hashimoto | 324/522 |
| 2012/0102351 | A1 * | 4/2012 | Tomi | 713/340 |
| 2012/0200883 | A1 * | 8/2012 | Ikari | 358/1.15 |
| 2012/0313439 | A1 * | 12/2012 | Yamaguchi et al. | 307/71 |

\* cited by examiner

*Primary Examiner* — Huy Q Phan
*Assistant Examiner* — Temilade Rhodes-Vivour
(74) *Attorney, Agent, or Firm* — Novak Druce Connolly Bove + Quigg LLP

(57) ABSTRACT

A current monitoring system for monitoring at least one current terminal of a motherboard includes at least one current monitoring unit and an indication device connected to the at least one current monitoring unit. Each current monitoring unit determines whether a current output from a corresponding current terminal is abnormal. The indication device encodes and displays a determination of the current monitoring unit and alarms according to the determination.

11 Claims, 2 Drawing Sheets

SERVER WITH CURRENT MONITORING SYSTEM

BACKGROUND

1. Technical Field

The disclosure generally relates to servers, particularly to a server comprising a current monitoring system.

2. Description of Related Art

After functioning for a long period of time, electronic components employed by a server may get into an exhaustion failure period. For example, current terminals of motherboards in the server may be worn out and fail to output currents. Therefore, it is important to monitor whether the current terminals of the motherboards can output currents normally and correctly.

Therefore, there is room for improvement within the art.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the disclosure.

DETAILED DESCRIPTION

Figure 1:
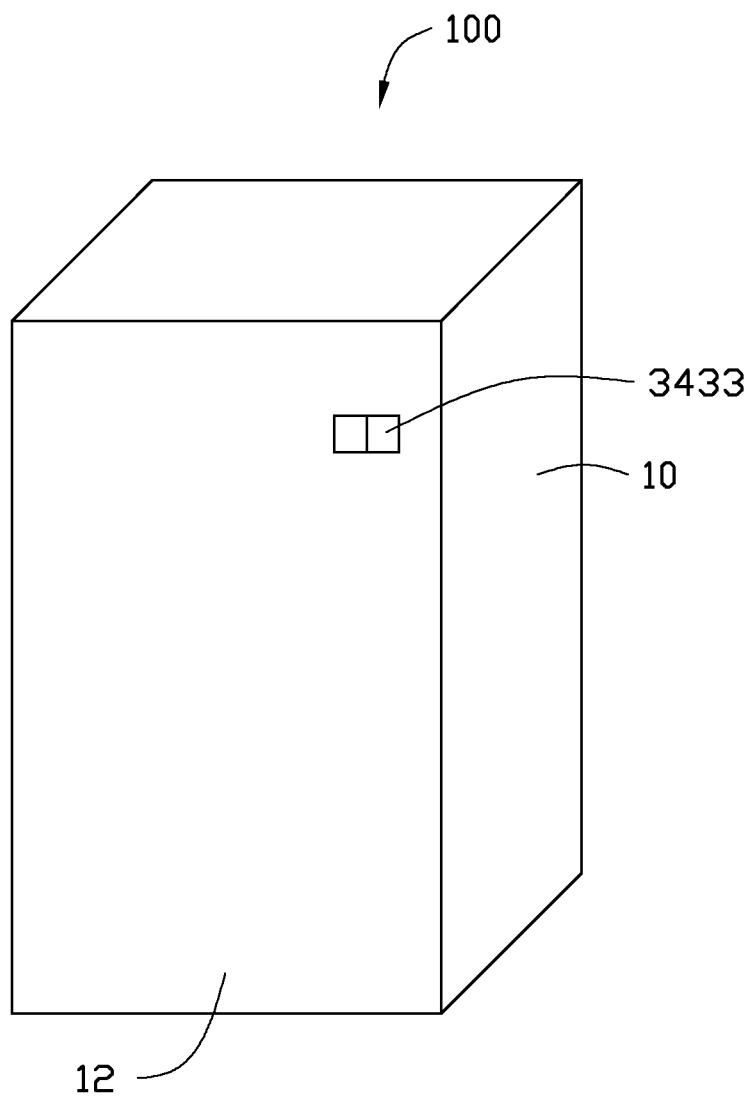
FIG. 1 shows a schematic view of an exemplary embodiment of a server.
Figure 2:
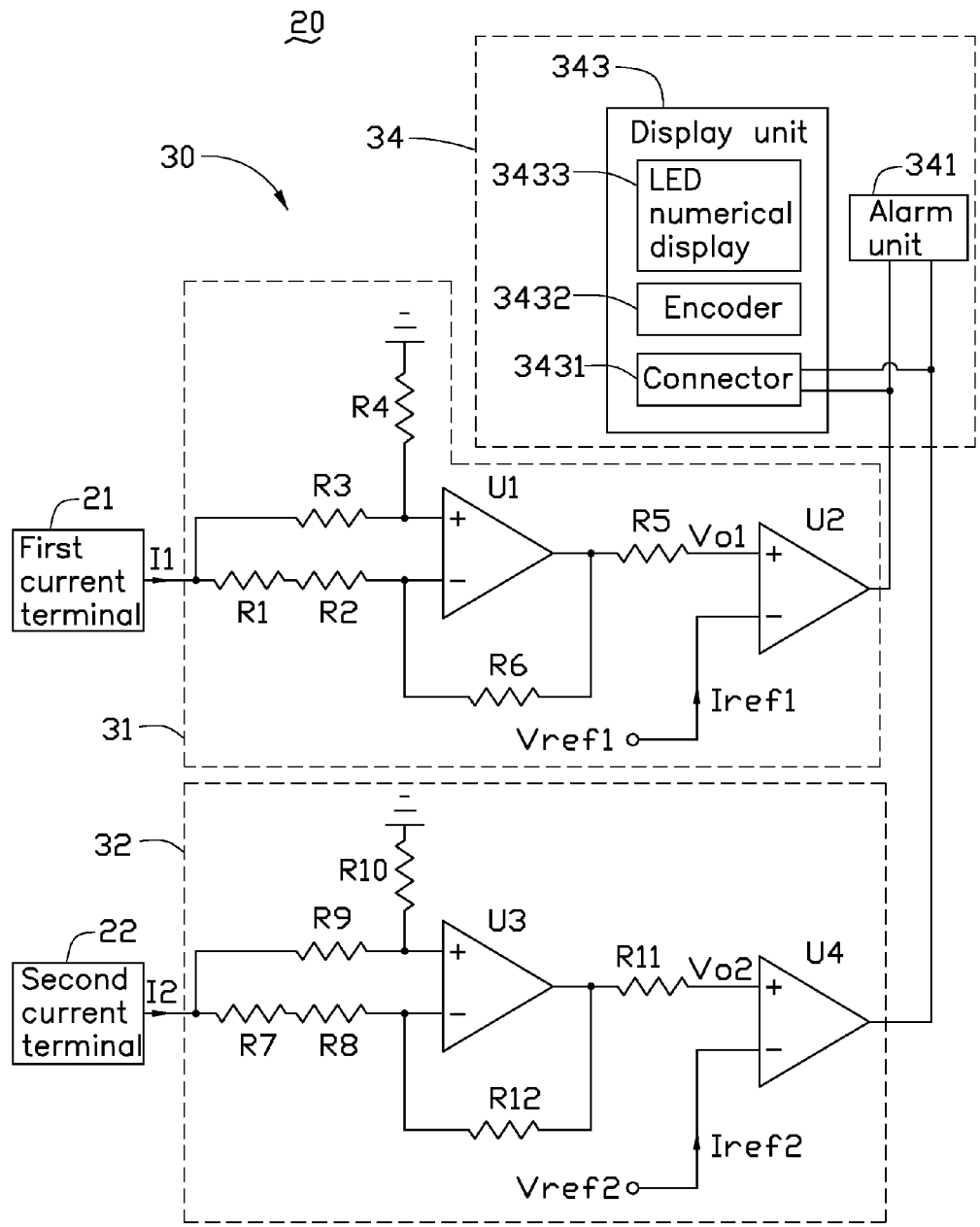
FIG. 2 shows a circuit diagram of the server shown in FIG. 1.

FIG. 1 shows a schematic view of an exemplary embodiment of a server 100. FIG. 2 shows a circuit diagram of the server 100 shown in FIG. 1. The server 100 includes an enclosure 10, a motherboard 20 received in the enclosure 10, and a current monitoring system 30. In the exemplary embodiment, the motherboard 20 includes a first current terminal 21, and a second current terminal 23. The first current terminal 21 outputs a first current I1, and the second current terminal 21 outputs a second current I2.

The current monitoring system 30 includes an indication device 34, and at least one current monitoring unit corresponding to and electronically connecting to the current terminals, e.g., a first current monitoring unit 31 electronically connecting to the first current terminal 21, and a second current monitoring unit 32 electronically connecting to the second current terminal 22. The indication device 34 includes an alarm unit 341 and a display unit 343.

The first current monitoring unit 31 compares the first current I1 with a first reference current Iref1, and determines whether the first current I1 is normal or abnormal according to the first reference current Iref1. In the exemplary embodiment, the first reference current Iref1 is an upper limit current of the first current I1.

The second current monitoring unit 32 compares the second current I2 with a second reference current Iref2, and determines whether the second current I2 is normal or abnormal according to the second reference current Iref2. In the exemplary embodiment, the second reference current Iref2 is an upper limit current of the second current I2.

The first current monitoring unit 31 is arranged on the motherboard 20. The first current monitoring unit 31 includes a first current detection resistor R1, a first amplifier U1, a first comparator U2, and resistors R2-R6. The first current detection resistor R1 is electronically connected between a non-inverting terminal an inverting terminal of the first amplifier U1, a node between the first current detection resistor R1 and the non-inverting terminal of the first amplifier U1 is electronically connected to the first current terminal 21. An output terminal of the first amplifier U1 is electronically connected to an inverting terminal of the first comparator U2 via the resistor R5. A non-inverting terminal of the first comparator U2 is electronically connected to a first reference power supply Vref1 of the motherboard 20, and an output terminal of the first comparator U2 is electronically connected to the alarm unit 341 and the display unit 343. The resistor R2 is electronically connected between the first current detection resistor R1 and the inverting terminal of the first amplifier U1. The resistor R3 is electronically connected between the first current detection resistor R1 and the non-inverting terminal of the first amplifier U1. A node between the resistor R3 and the non-inverting terminal of the first amplifier U1 is grounded via the resistor R4. The resistor R6 is electronically connected between the inverting terminal and the output terminal of the first amplifier U1.

The first amplifier U1 and the resistors R2-R6 cooperate to form a voltage amplifying circuit which amplifies a voltage potential difference between two terminals of the first current detection resistor R1, and outputs the amplified voltage potential difference, that is a first output voltage Vo1, to the inverting terminal of the first comparator U2. The value of the first output voltage Vo1 is a product of the resistance of the first detection resistor R1, the value of the first current I1, and a magnification of the first amplifier U1. The value of an output voltage of the first reference power supply Vref1 is set to satisfy a product of the resistance of the first detection resistor R1, the value of the first reference current Iref1, and the magnification of the first amplifier U1. Thus, when the first current I1 is normal, that is, lower than the first reference current Iref1, the first comparator U1 outputs a high level voltage signal (e.g. logic 1). Alternatively, when the first current I1 is higher than the first reference current Iref1, the first comparator U1 outputs a low level voltage signal (e.g. logic 0).

The second current detection circuit 32 is arranged on the motherboard 20, and includes a second current detecting resistor R7, a second amplifier U3, a second comparator U4, and resistors R8-R12. The second current detection resistor R7 is electronically connected between a non-inverting terminal an inverting terminal of the second amplifier U3, a node between the second current detection resistor R7 and the non-inverting terminal of the second amplifier U3 is electronically connected to the second current terminal 22. An output terminal of the second amplifier U3 is electronically connected to an inverting terminal of the second comparator U4 via the resistor R11. A non-inverting terminal of the second comparator U4 is electronically connected to a second reference power supply Vref2 of the motherboard 20, and an output terminal of the second comparator U3 is electronically connected to the alarm unit 341 and the display unit 343. The resistor R8 is electronically connected between the second current detection resistor R7 and the inverting terminal of the second amplifier U3. The resistor R9 is electronically connected between the second current detection resistor R3 and the non-inverting terminal of the second amplifier U3. A node between the resistor R9 and the non-inverting terminal of the second amplifier U3 is grounded via the resistor R10. The resistor R12 is electronically connected between the inverting terminal and the output terminal of the second amplifier U3.

The second amplifier U3 and the resistors R8-R12 are formed another voltage amplifying circuit which amplifies a voltage potential difference between two terminals of the second current detection resistor R7, and outputs the amplified voltage potential difference, that is a second output voltage Vo2, to the inverting terminal of the second comparator U4. The value of the second output voltage Vo2 is a product of the resistance of the second detection resistor R7, the value of the second current I2, and a magnification of the second amplifier U3. The value of an output voltage of the second reference power supply Vref2 is set to satisfy a product of the resistance of the second detection resistor R7, the value of the second reference current Iref2, and the magnification of the second amplifier U7. Thus, when the second current I2 is normal, that is, lower than the second reference current Iref2, the second comparator U4 outputs a high level voltage signal (e.g. logic 1). Alternatively, when the second current I2 is higher than the second reference current Iref2, the second comparator U4 outputs a low level voltage signal (e.g. logic 0).

In the exemplary embodiment, the alarm unit 341 is activated by a low level voltage signal. When at least one of the first current I1 and the second current I2 is abnormal, the corresponding first and second current detection units 31 and 33 output the low level voltage signal, to activate the alarm unit 341. The alarm unit 341 can be a light-emitting diode (LED), a loudspeaker, or the combination of the LED and the loudspeaker.

The display unit 343 includes a connector 3431 an LED numerical display 3433, and an encoder 3432 connecting the connector 3431 to the LED numerical display 3433. The connector 3431 and the encoder 3432 are mounted on the motherboard 20. The LED numerical display 3433 is mounted on a front panel 12 of the enclosure 10. The connector 3431 is electronically connected to the output terminal of the first comparator U2 of the first current detection unit 31 and the output terminal of the second comparator U4 of the second current detection unit 32. The encoder 3432 receives signals from the output terminals of the first and second comparators U2 and U4, and encodes the signals into codes. The LED numerical display 3433 receives the codes and displays the codes, which can denote whether the first or/and second current I1 and I2 are abnormal. For example, when the first current I1 is abnormal, and the second current I2 is normal, the first comparator U2 outputs a low level voltage signal (logic 0), and the second comparator U4 outputs a high level voltage signal (logic 1). The encoder 3432 outputs codes "01" to denote that the first current I1 is abnormal.

In other embodiments, the output terminal of the first amplifier U1 can be electronically connected to the non-inverting terminal of the first comparator U2, and the first reference power supply Vref1 is electronically connected to the inverting terminal of the first comparator U2. At this time, the first comparator U2 outputs high level voltage signal (logic 1) when the first current I1 of the first current terminal 21 is abnormal, and the first comparator U2 outputs low level voltage signal (logic 0) when the first current I1 of the first current terminal 21 is normal.

In the server 100 of the disclosure, the current detection system 30 detects the currents output from the current terminals of the motherboard 20. If only at least one current terminal is abnormal, the alarm unit 341 alarms, and the display unit 343 denotes the at least one abnormal current terminal. Therefore, the current detection system 30 can quickly and conveniently test the current terminals of the motherboard 20, and thus increase a stability and reliability of the server 100.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A current monitoring system, comprising:
   at least one current monitoring unit, each of the at least one current monitoring unit comprising a current detection resistor, an amplifier, and a comparator; and
   an indication device electronically connected to an output terminal of the comparator of each of the at least one current monitoring unit;
   wherein the current detection resistor is electronically connected between a non-inverting terminal and an inverting terminal of the amplifier, a node between the current detection resistor and the non-inverting terminal of the amplifier is electronically connected to a current terminal of a motherboard, one of a non-inverting terminal and an inverting terminal of the comparator is electronically connected to an output terminal of the amplifier, the other one of the non-inverting terminal and the inverting terminal of the comparator is electronically connected to a reference power supply; the comparator compares an output voltage of the amplifier with an output voltage of the reference power supply, to determine whether a current output from the corresponding current terminal is abnormal; the indication device encodes and displays a determination of the comparator and alarms according to the determination; and
   wherein the indication device comprises a display unit comprising a connector, an LED numerical display, and an encoder connecting the connector to the LED numerical display, the connector is electronically connected to the output terminal of the comparator of each current detection unit, the encoder receives signals from the output terminal of the comparator, and encodes the signals into codes, the LED numerical display receives the codes and display the codes, to denote whether the current of the current terminal is abnormal.

2. The current monitoring system of claim 1, wherein a value of the output voltage of the reference power supply is a product of the resistance of the current detection resistor, a value of a reference current, and a magnification of the amplifier, the reference current is an upper limit current of the current output from the current terminal.

3. The current monitoring system of claim 1, wherein each current detection unit comprises a first resistor, a second resistor, a third resistor, a fourth resistor, and a fifth resistor, the first resistor is electronically connected to between the current detection resistor and the inverting terminal of the amplifier; the second resistor is electronically connected between the current detection resistor and the non-inverting terminal of the amplifier; a node between the second resistor and the non-inverting terminal of the amplifier is grounded via the third resistor; the fourth resistor is electronically connected between the output terminal of the amplifier and the comparator; and the fifth resistor is electronically connected to the inverting terminal and the output terminal of the amplifier.

4. The current monitoring system of claim 1, wherein the indication device comprises an alarm unit electronically connected to the output terminals of the comparator of each of the at least one current monitoring unit, the alarm unit is activated when at least one current of the current terminal is abnormal.

5. The current monitoring system of claim 4, wherein the alarm unit is one of a loudspeaker and a LED.

6. A server, comprising:
   a motherboard comprising at least one current terminal to output at least one current;

at least one current monitoring unit, each of the at least one current monitoring unit comprising a current detection resistor, an amplifier, and a comparator; and an indication device electronically connected to an output terminal of the comparator of each of the at least one current monitoring unit;

wherein the current detection resistor is electronically connected between a non-inverting terminal and an inverting terminal of the amplifier, a node between the current detection resistor and the non-inverting terminal of the amplifier is electronically connected to a corresponding current terminal of the motherboard, one of a non-inverting terminal and an inverting terminal of the comparator is electronically connected to an output terminal of the amplifier, the other one of the non-inverting terminal and the inverting terminal of the comparator is electronically connected to a reference power supply; the comparator compares an output voltage of the amplifier with an output voltage of the reference power supply, to determine whether a current output from the corresponding current terminal is abnormal; the indication device encodes and displays a determination of the comparator and alarms according to the determination; and wherein the indication device comprises a display unit comprising a connector, an LED numerical display, and an encoder connecting the connector to the LED numerical display, the connector is electronically connected to the output terminal of the comparator of each current detection unit, the encoder receives signals from the output terminal of the comparator, and encodes the signals into codes, the LED numerical display receives the codes and display the codes, to denote whether the current of the current terminal is abnormal.

7. The server of claim 6, wherein a value of the output voltage of the reference power supply is a product of the resistance of the current detection resistor, a value of a reference current, and a magnification of the amplifier, the reference current is an upper limit current of the current output from the current terminal.

8. The server of claim 6, wherein each current detection unit comprises a first resistor, a second resistor, a third resistor, a fourth resistor, and a fifth resistor, the first resistor is electronically connected to between the current detection resistor and the inverting terminal of the amplifier; the second resistor is electronically connected between the current detection resistor and the non-inverting terminal of the amplifier; a node between the second resistor and the non-inverting terminal of the amplifier is grounded via the third resistor; the fourth resistor is electronically connected between the output terminal of the amplifier and the comparator; and the fifth resistor is electronically connected to the inverting terminal and the output terminal of the amplifier.

9. The server of claim 6, wherein the server further comprises an enclosure that comprises a front panel, the current monitoring unit is arranged on the motherboard, the motherboard is received in the enclosure, and the LED numerical display is mounted on the front panel of the enclosure.

10. The server of claim 6, wherein the indication device comprises an alarm unit electronically connected to the output terminals of the comparator of each of the at least one current monitoring unit, the alarm unit is activated when at least one current of the current terminal is abnormal.

11. The server of claim 10, wherein the alarm unit is one of a loudspeaker and a LED.

* * * * *